United States Patent [19]
Kamekawa et al.

[11] Patent Number: 5,816,319
[45] Date of Patent: Oct. 6, 1998

[54] COOLING RADIATOR

[75] Inventors: Yutaka Kamekawa; Kiyoshi Nakayama; Satoshi Nakamura, all of Tokyo, Japan

[73] Assignee: Nippon Keiki Works Co., Ltd., Tokyo, Japan

[21] Appl. No.: 744,077

[22] Filed: Nov. 4, 1996

[30] Foreign Application Priority Data

Nov. 6, 1995 [JP] Japan ................................. 7-311611
Nov. 7, 1995 [JP] Japan ................................. 7-313559

[51] Int. Cl.$^6$ ....................................................... H05K 7/20
[52] U.S. Cl. ......................... 165/121; 165/80.3; 361/697
[58] Field of Search .................................. 165/80.3, 121, 165/185; 361/697, 704; 174/16.3

[56] References Cited

U.S. PATENT DOCUMENTS

| | | | |
|---|---|---|---|
| 5,535,094 | 7/1996 | Nelson et al. | 361/697 |
| 5,597,034 | 1/1997 | Barker, III et al. | 165/80.3 |
| 5,629,834 | 5/1997 | Kodama et al. | 361/695 |
| 5,630,469 | 5/1997 | Butterbaugh et al. | 165/80.3 |
| 5,661,638 | 8/1997 | Mira | 361/697 |

OTHER PUBLICATIONS

Hwang and Simons, Push Pull Multi–Flow System for Air–Cooled Modules from IBM Tech. Disclosure Bulletin vol. 22 No. 2, Jul. 1979.

Primary Examiner—Allen J. Flanigan
Attorney, Agent, or Firm—Armstrong, Westermann, Hattori, McLeland, & Naughton

[57] ABSTRACT

The present invention relates to improvements on a cooling radiator for cooling a heating element by radiating and removing heat generated by a heating element, such as CPU. In a cooling radiator with a fan according to the present invention, which is used as a countermeasure against heat at the CPU in personal computers, etc., said cooling radiator comprises a bottom plate on which a plurality of protruding portions are formed, a fan to make air flow in and out, a driving motor to rotate the fan, a partition board to separate inflow air from outflow air, and a lid, and in a cooling radiator for cooling a heating element such as CPU, said cooling radiator comprises a bottom plate on which a plurality of protruding portions and a plurality of partition boards are provided, a fan to suck air and blow out air, a driving motor to rotate the fan, and a lid, wherein an inlet port to suck air and an outlet port to blow out air are provided on the sides of the cooling radiator.

10 Claims, 16 Drawing Sheets

COOLING RADIATOR

BACKGROUND OF THE INVENTION

1. Field of the Invention

The present invention relates to improvements in a cooling radiator for cooling an element by radiating and removing heat generated by a heating element, such as a CPU.

The power consumption of heating elements, such as CPUs used in electronic equipment, such as personal computers, has increased because of advanced functions. Accordingly, the calorific power generated by heating elements has also increased. Therefore, it becomes urgent to remove excess heat generated by a heating element, such as a CPU. In addition, the present invention has been made, as described with a thin, light cooling radiator for thin, light notebook-type personal computers.

2. Description of the Related Art

Conventionally, a cooling radiator with a fan for removing heat generated by a CPU was fixed on CPU7 with bands, as shown in FIG. 6 and removed heat generated by the CPU. In the conventional cooling radiator 1e, heat generated by CPU7 was transferred to protruding portions of a radiating part. Air flow into the cooling radiator 1e is induced by the rotation of an axial fan 8 from the direction shown by arrow b and flows out to the direction shown by arrow c while cooling the protruding portions of the radiating part.

The conventional cooling radiator for cooling the CPU comprises a bottom plate 2 having protruding portions 2a, 2a, ..., a lid 3, a driving motor 5, and an axial fan 8 attached to the driving motor 5 as shown in FIG. 7. A hole is provided in the lid 3 so that the axial fan 8 can be inserted and removed. The upper surface of the axial fan 8 becomes even with the upper surface of the lid 3. Thus, when the driving motor 5 is driven, the axial fan starts rotating. Air flows in from the direction shown by arrow b and flows out to the direction shown by arrow c.

In addition, a conventional cooling radiator for removing heat generated by a heating element, such as a CPU sucks air from a hole 25 provided in the lid 12 of a cooling radiator 11d, as shown in FIG. 23, and blows air to gaps 13b on the sides of the cooling radiator. In this structure, because air is sucked from the hole 25 which is provided in the lid 12 of the cooling radiator and blows out to the gaps 13b on the sides of the cooling radiator 11d, it was necessary to provide a predetermined space 28 in between a keyboard mounting plate 27 and a cooling radiator 11d to suck air from the hole 25 even if the cooling radiator 11d is mounted on the CPU26, as shown in FIG. 24.

That is, in such a structure where air is sucked from the top, as shown by arrow b, and blown out to the horizontal direction by the axial fan 8, as shown in FIG. 7, a space having a certain size had to be provided near the inlet port to suck air from the top. There was a defect in that the mounting width of a cooling radiator including a space near the inlet port had to be made thicker than that of the cooling radiator 1e itself.

That is, in this structure where air is sucked from the hole 25 provided in the lid 12 of the conventional cooling radiator 11d and air is blown out to the gap 13b on the side, as shown in FIGS. 23 and 24, a space 28 had to be provided in between hole 25 for sucking air and the keyboard mounting plate 27 to suck air from the hole 25 provided in the lid 12. Therefore, it is difficult to make personal computers thin and light because the upper surface of the cooling radiator 11d could not get close to the keyboard mounting plate 27 or internal parts.

SUMMARY OF THE INVENTION

It is an object of the present invention to provide a very thin cooling radiator by eliminating dead space at the upper surface of the driving motor and to provide a cooling radiator which can radiate heat generated by a CPU efficiently.

It is another object of the present invention to provide a thin and light-weight cooling radiator by eliminating the necessity to provide a space in between the keyboard mounting plate and the cooling radiator in a structure in which air is sucked from the sides of the cooling radiator and blown out to the sides of the cooling radiator so that the air flow path can occur on the same plane.

A cooling radiator with a fan used as a countermeasure against heat at the CPU in personal computers, etc., comprises a bottom plate on which a plurality of protruding portions are formed, a fan to make air flow in and out, a driving motor to rotate the fan, a partition board to separate inflow air from outflow air, and a lid, wherein an inlet port to suck air and an outlet port to blow out air are provided on the sides of the cooling radiator.

DETAILED DESCRIPTION OF THE PREFERRED EMBODIMENTS

The radiator for cooling the CPU of the present invention will be described referring to drawings.

Figure 1:
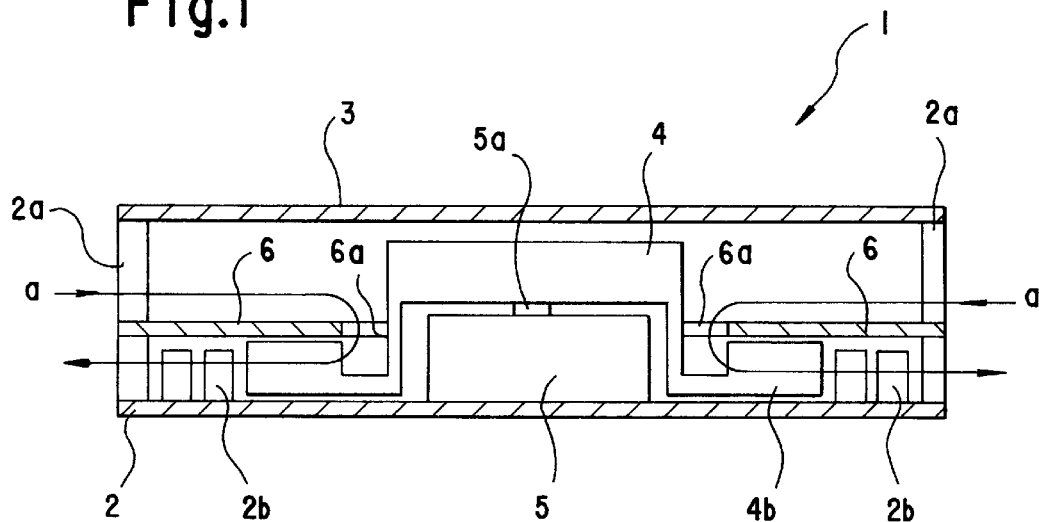
FIG. 1 is a vertical sectional view of a first embodiment of a cooling radiator according to the present invention.

FIG. 1 is a vertical sectional view showing a first embodiment of a cooling radiator of the present invention. The cooling radiator 1 of the embodiment comprises a bottom plate 2 in which support posts 2a, 2a, 2a, 2a, . . . and a plurality of protruding portions posts 2b, 2b, . . . are formed on the outer side of a fan 4, a fan 4, a driving motor 5 on which the fan 4 is rotatably mounted, a partition board 6 in which a hole 6a, the diameter of which is slightly greater than that of the fan 4, is provided, and a lid 3. The partition board 6 is provided to smooth the air flow by separating the air inflow path from the air outflow path. In the cooling radiator of the embodiment, the blades 4b of fan 4 are located under the partition board 6.

The fan 4 is fixed at the top of the shaft 5a of the driving motor 5. When fan 4 is rotated at high speed, the air flows in the direction shown by arrow a. That is, when fan 4 is rotated, the air flows in from the air inflow path between the lid 3 and the partition board 6 and flows out to the air outflow path between the partition board 6 and the protruding portions 2b, 2b, 2b, 2b, 2b, . . . formed on the bottom plate 2. The direction of the air flow shown is only an example. The direction of the air flow can be changed to the opposite direction by changing the direction of the rotation of the fan.

Figure 2:
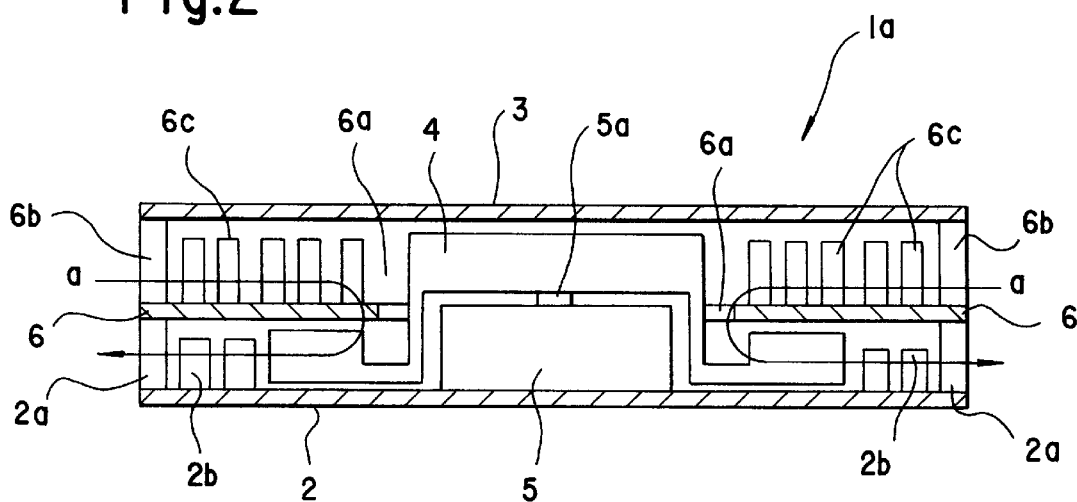
FIG. 2 is a vertical sectional view of a second embodiment of a cooling radiator according to the present invention.

FIG. 2 is a vertical sectional view showing a second embodiment of the cooling radiator of the present invention. The cooling radiator 1a of the embodiment comprises a bottom plate 2 on which support posts 2a, 2a, 2a, 2a, . . . and a plurality of protruding portions or posts 2b, 2b, 2b, 2b, . . . are formed, a partition board 6 on which support posts 6b, 6b, 6b, 6b, . . . and a plurality of protruding portions of posts 6c, 6c, 6c, 6c, . . . are formed, a lid 3, a fan 4, and a driving motor 5 for rotating the fan 4. The cooling radiator 1a of the embodiment is characterized in that support posts 6b, 6b, 6b, 6b, . . . and protruding portions 6c, 6c, 6c, 6c, . . . are formed on the partition board 6. In the embodiment, similar to the example shown in FIG. 1, the blades 4b of fan 4 are located under the partition board 6.

The fan 4 is fixed on the shaft 5a of the driving motor 5. When fan 4 is rotated, the air flows in the direction shown by arrow a. That is, unlike the conventional cooling radiator 1e, when fan 4 is rotated, the air flows in from the gaps between the protruding portions 6c, 6c, 6c, 6c, . . . formed on the partition board 6 and flows out to the gaps between the protruding portions 2b, 2b, 2b, 2b, . . . formed on the bottom plate 2.

Figure 3:
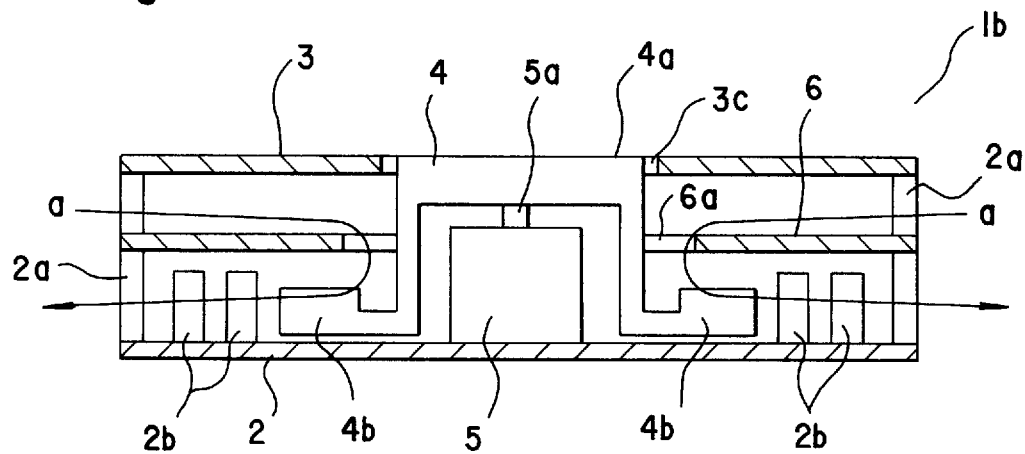
FIG. 3 & 3a are is a vertical sectional views of a third embodiment of a cooling radiator according to the present invention.

FIG. 3 is a vertical sectional view showing a third embodiment of a cooling radiator of the present invention. The cooling radiator 1b of the embodiment comprises a bottom plate 2 on which support posts 2a, 2a, 2a, 2a, . . . and a plurality of protruding portions or posts 2b, 2b, . . . are formed, a fan 4, a driving motor 5 on which fan 4 is rotatably mounted, a partition board 6, and a lid 3. In the cooling radiator 1b of the embodiment, a hole 3c for housing the upper surface of fan 4 is formed and the upper surface of fan 4 becomes even with that of the lid 3. Thus, the thickness of the cooling radiator can be made thinner by providing a hole 3c in the lid 3 of the cooling radiator 1b. Also in the cooling radiator 1b of the embodiment, the blades 4b of fan 4 are located under the partition board 6.

The fan 4 is fixed on the shaft 5a of the driving motor 5. When fan 4 is rotated at high speed, the air flows in the direction shown by arrow a. That is, unlike the conventional cooling radiator 1e, when fan 4 is rotated, the air flows in from the gaps between the lid 3 and the partition board 6, and flows out to the gaps between the partition board 6 and the protruding portions 2b, 2b, 2b, 2b, 2b, . . . formed on the bottom plate 2.

Figure 3A:
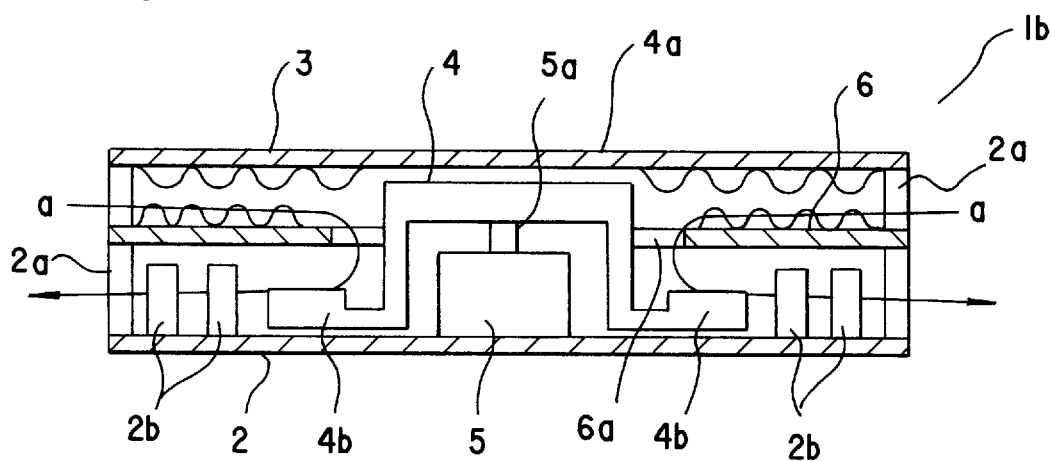

FIG. 3a shows a cooling radiator illustrating an example of irregularities formed on a lid or a partition board. Corrugated irregularities can be formed on a lid 3 and partition board 6 shown in FIGS. 1, 2, 3, 4, and 5 illustrating each embodiment of the cooling radiator of the present invention. The formation of such corrugated irregularities makes the heat radiation more efficient and smooths the air flow. Irregularities can be formed only on the surface of the lid 3. Alternatively, irregularities can be formed only on the surface of partition board 6. Furthermore, irregularities can be formed on both lid 3 and partition board 6.

Figure 4:
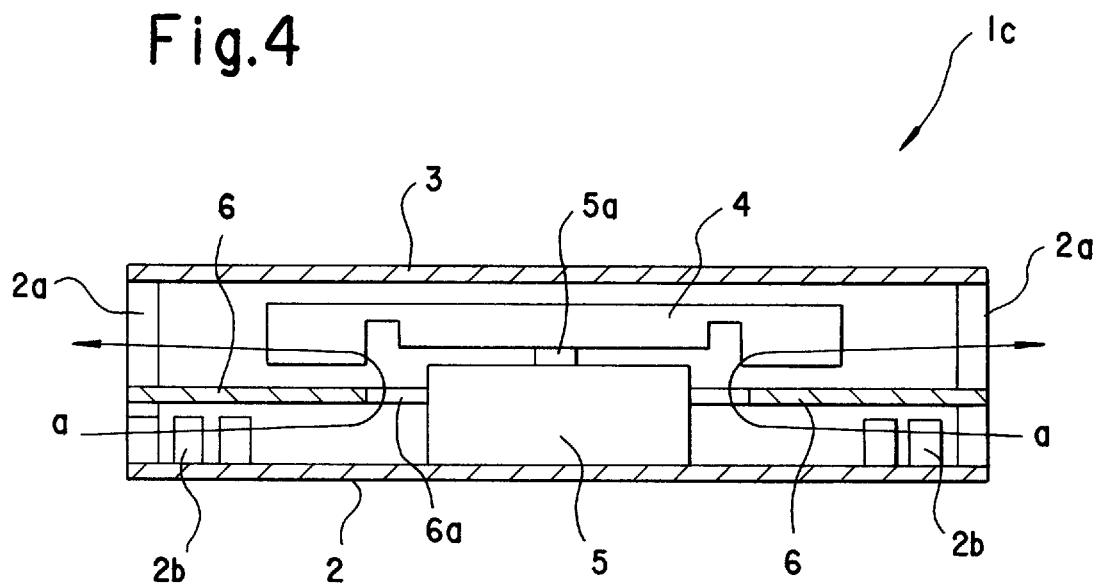
FIG. 4 is a vertical sectional view of a fourth embodiment of a cooling radiator according to the present invention.

FIG. 4 is a vertical sectional view of a fourth embodiment of the cooling radiator of the present invention. The cooling radiator 1c of the embodiment comprises a bottom plate 2 on which support posts 2a, 2a, 2a, 2a, . . . and a plurality of protruding portions or posts 2b, 2b, . . . are formed, a fan 4, a driving motor 5 on which the fan 4 is rotatably mounted, a partition board 6 on which a hole, the diameter of which is slightly greater than that of fan 4, is provided, and a lid 3. The partition board 6 is provided to smooth the air flow by separating the air inflow path from the air outflow path. In the embodiment, the entire portion of fan 4 having blades 4c is located above the partition board 6.

The fan 4 is fixed on the shaft 5a of the driving motor 5. When fan 4 is rotated, the air flows in the direction shown by arrow a. That is, unlike the conventional cooling radiator, when fan 4 is rotated, the air flows in from the air inflow path between the bottom plate 2 and the partition board 6 and flows out to the air outflow path between the partition board 6 and the lid 3.

Figure 5:
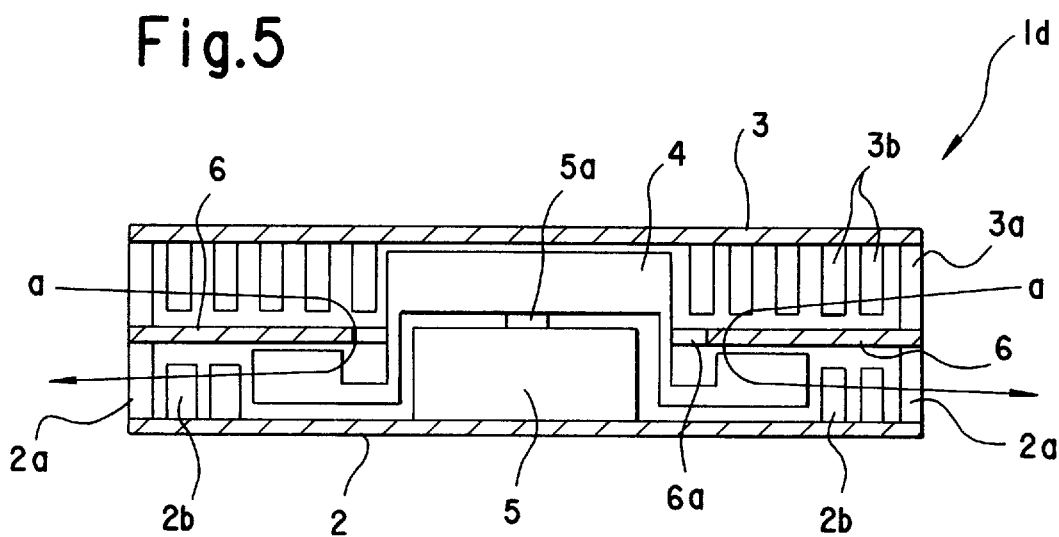
FIG. 5 is a vertical sectional view of a fifth embodiment of a cooling radiator according to the present invention.
Figure 6:
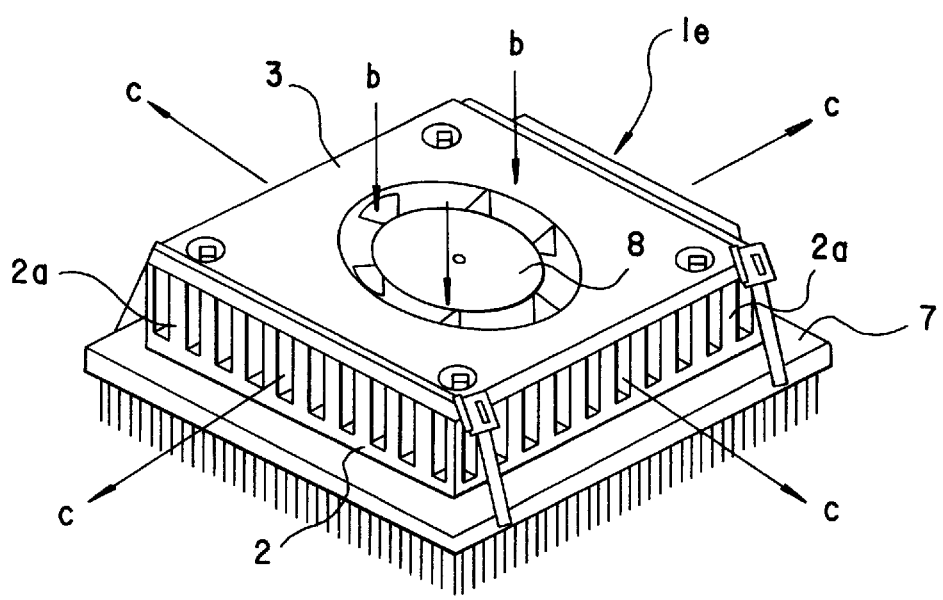
FIG. 6 is a perspective view of a well-known cooling radiator mounted on CPU.
Figure 7:
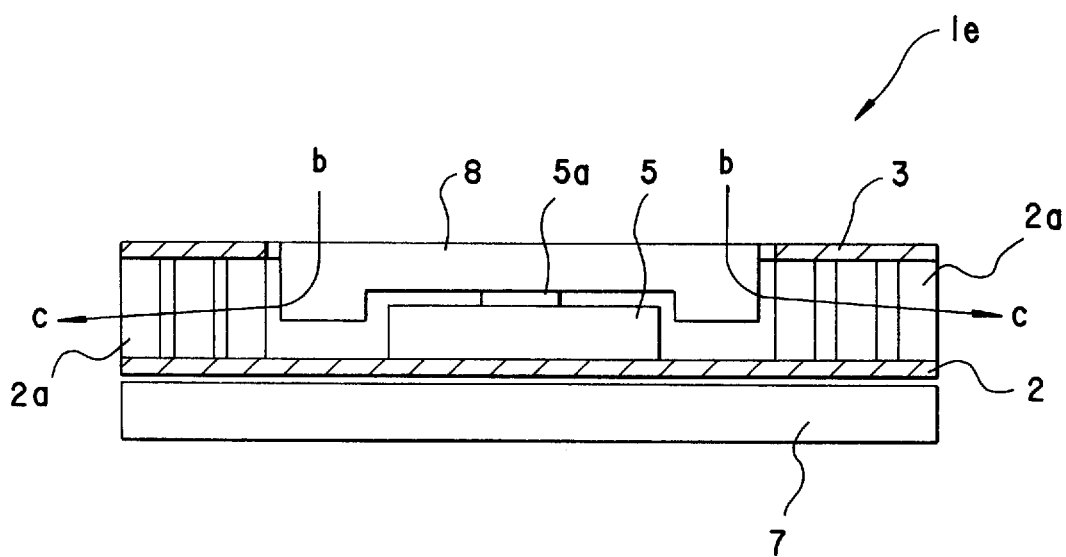
FIG. 7 is a vertical sectional view of a well-known cooling radiator mounted on CPU.

FIG. 5 is a vertical sectional view showing a fifth embodiment of the cooling radiator of the present invention. The cooling radiator 1d of the embodiment comprises a bottom plate 2 on which support posts 2a, 2a, 2a, 2a, . . . and a plurality of protruding portions or posts 2b, 2b, . . . are formed, a lid 3 on which support posts 3a, 3a, 3a, 3a, . . . and a plurality of protruding portions or posts 3b, 3b, 3b, 3b, . . . are formed, a fan 4 having blades 4c, a driving motor 5 on which the fan 4 is rotatably mounted, and a partition board 6. In the cooling radiator 1d of the embodiment, support posts 3a, 3a, 3a, 3a, . . . and a plurality of protruding portions or posts 3b, 3b, 3b, 3b, . . . are also formed on the lid 3. In the cooling radiator 1d, the blades 4b of fan 4 are located under the partition board 6.

When the driving motor is actuated, fan 4 is rotated at high speed and the air flows in the direction shown by arrow a. That is, when fan 4 is rotated, the air flows in from the air inflow path between the support posts 3a, 3a, 3a, 3a, . . . and a plurality of protruding portions 3b, 3b, 3b, . . . of the lid 3 and the partition board 6 and flows out to the air outflow path between the partition board 6 and the protruding portions 2b, 2b, 2b, 2b, 2b, . . . formed on the bottom plate 2.

The cooling radiator of the present invention can be used as an air blower by removing protruding portions 2b, 3b, and 6c from the cooling radiator shown in FIGS. 1, 2, 3, 4, and 5.

Figure 8:
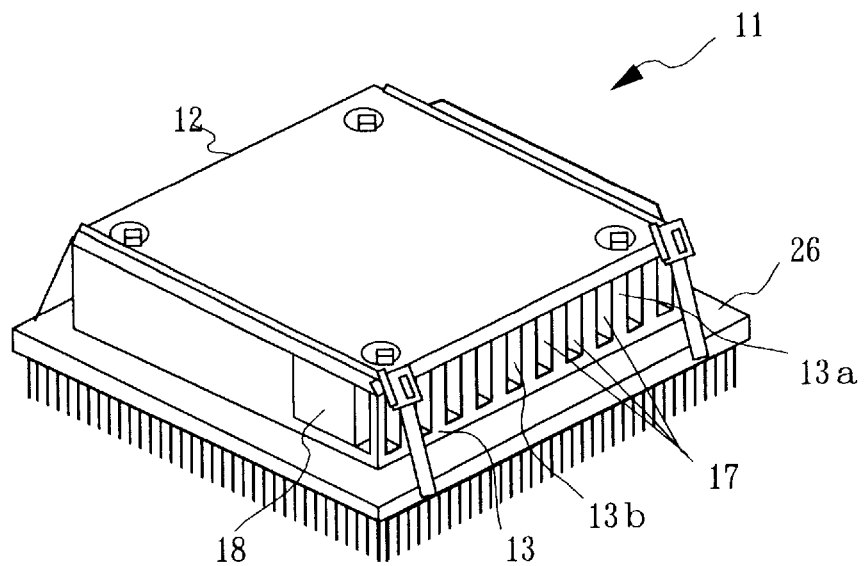
FIG. 8 is perspective view of a cooling radiator, which is mounted with bands on the lid of CPU, according to the present invention.
Figure 23:
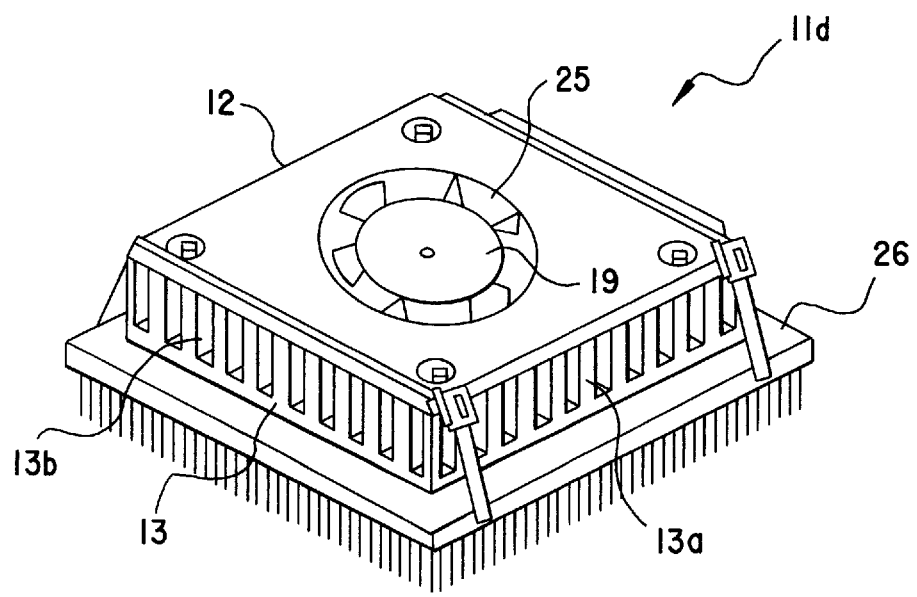
FIG. 23 is a perspective view of a well-known cooling radiator mounted on CPU.
Figure 24:
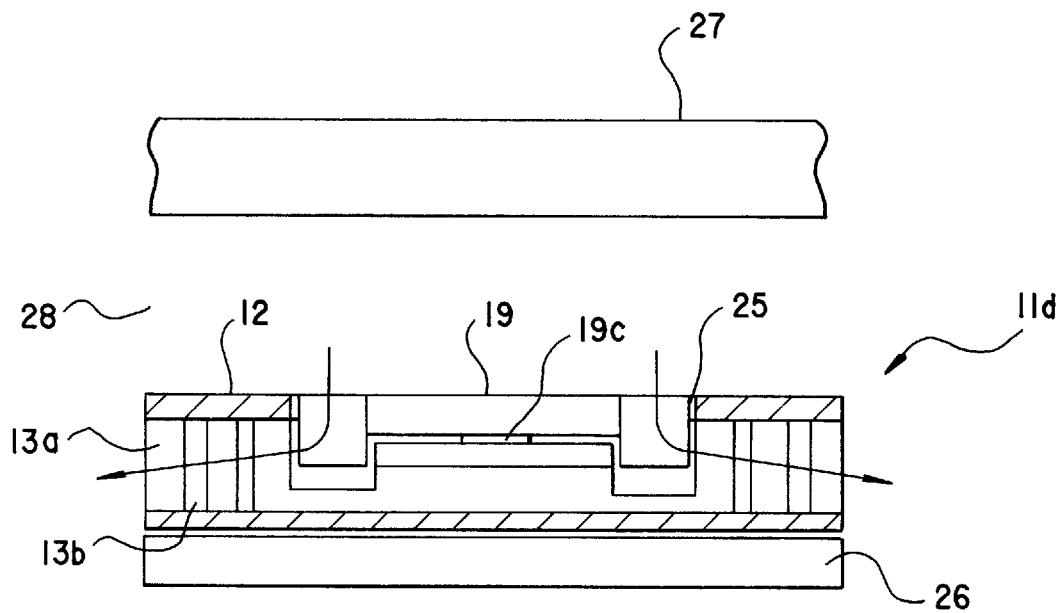
FIG. 24 illustrates a well-known cooling radiator which is mounted on CPU and then mounted under keyboard, etc.

FIG. 8 is a perspective view of the cooling radiator of the present invention, which is mounted on a CPU with band. As shown in FIG. 8, a hole 25 for sucking air, provided in the lid 12 of the conventional cooling radiator shown in FIG. 23, is not provided in the lid 12 of the cooling radiator of the present invention. In addition, inlet ports 17 to suck air and an outlet port 18 to blow out air are provided on the sides of the cooling radiator. Symbol 13a is a protruding portion formed on the bottom plate 13. Symbol 13b is a gap formed between protruding portions 13a.

Figure 9:
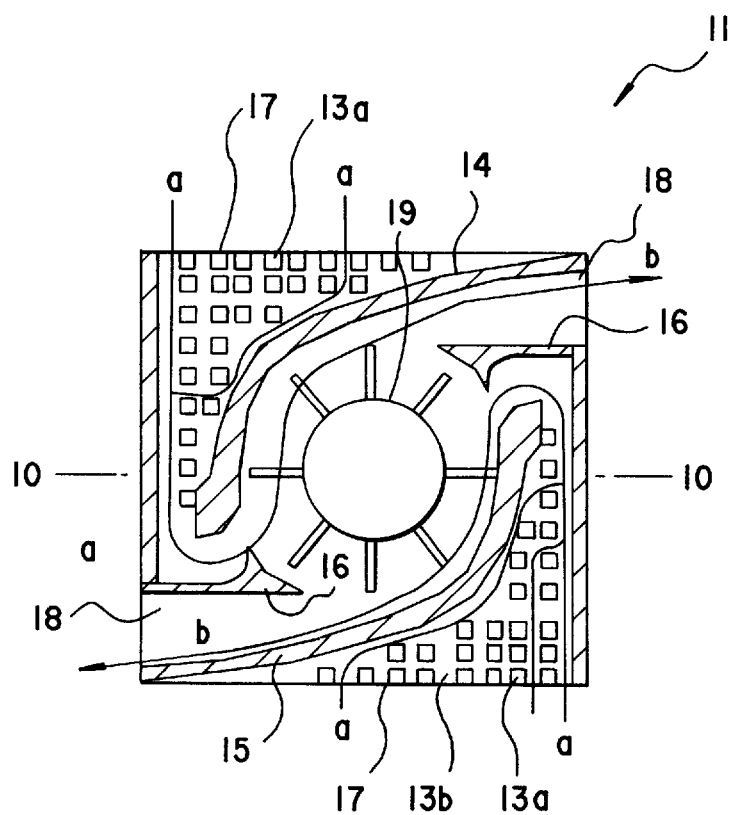
FIG. 9 is a top view of a cooling radiator, with the lid removed, according to the present invention.
Figure 10:
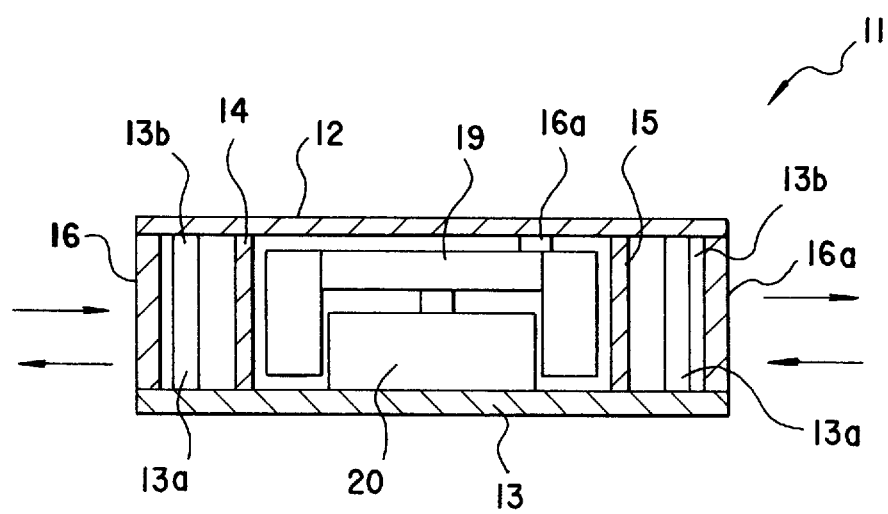
FIG. 10 is a partially vertical sectional view taken on line A—A of FIG. 9.

FIG. 9 is a top view of the cooling radiator with the lid removed of the present invention. FIG. 10 is a vertical sectional view taken on line A—A of FIG. 9. Symbol 13 shows a bottom plate. A number of protruding portions 13a, 13a, 13a, 13a, 13a, 13a, . . . are formed on the bottom plate 13 to make the heat radiation more efficient. In addition, the bottom plate 13 is provided with bent partition boards 14 and 15 and L-shaped partition boards 16 and 16a so as to surround the fan 19 to suck and blow out air from and to the sides of the cooling radiator.

The partition boards 14 and 15 shown in FIG. 9 are bent. This is for taking air smoothly by fan 19. Symbol 17 is an inlet port for sucking air and symbol 18 is an outlet port for blowing out air.

When fan 19 is rotated by the driving motor 20, air passes through the inlet port 17 between the partition boards 14 and 16 and the inlet port 17 between the partition boards 15 and 16a. Air passes through the gap 13b formed between the protruding portions 13a and flows in the direction to fan 19. Air is blown out to the outlet port 18 by fan 19. That is, air flows in the direction from a to b.

As shown in FIG. 10, partition boards 14, 15, 16, and 16a are all mounted on the bottom plate 13. The bent partition boards 14 and 15 and the L-shaped partition boards 16 and 16a are in contact with the underside of the lid 12.

Figure 11:
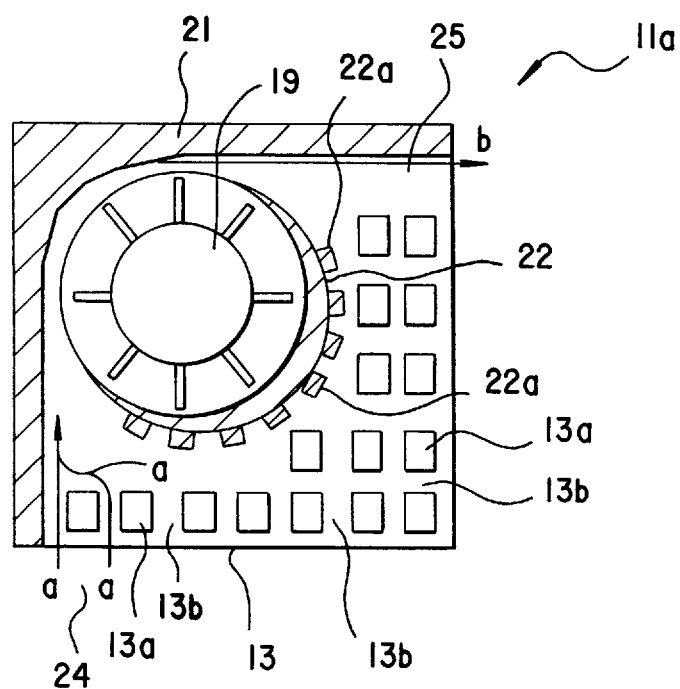
FIG. 11 is a top view of another embodiment of a cooling radiator, with the lid removed, according to the present invention.

FIG. 11 shows another embodiment of the cooling radiator of the present invention and is a top view with the lid removed. In the cooling radiator 11a of the embodiment, a plurality of protruding portions or posts 13a, 13a, 13a, 13a, 13a, . . . are formed on the bottom plate 13. An L-shaped partition board 21 and a crescent-shaped partition board 22 having a plurality of protruding portions 22a on the external wall are formed on the bottom plate 13. Furthermore, a fan 19 is mounted between the L-shaped partition board 21 and the crescent-shaped partition board22. The shape of the protruding portions 22a can be made in a corrugated form.

When fan 19 is rotated clockwise by the driving motor 20, air is sucked from the inlet port 24. Air flows in along the inner wall of the partition board 21 and flows out to the outlet port. That is, air flows in the direction from a to b.

Figure 12:
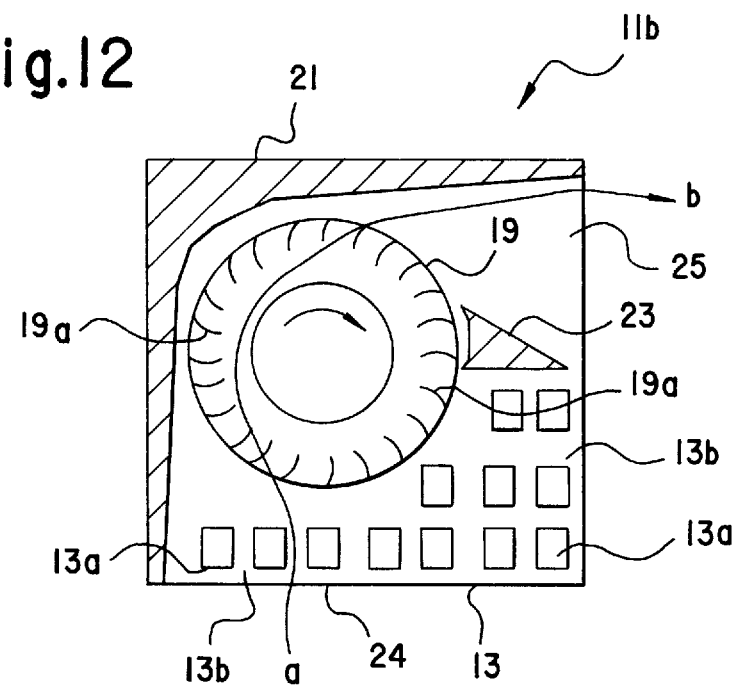
FIG. 12 is a top view of another embodiment of a cooling radiator, with the lid removed, according to the present invention.

FIG. 12 shows another embodiment of the cooling radiator of the present invention and is a top view with the lid removed. In the cooling radiator 11b of the embodiment, an L-shaped partition board 21 and a crescent-shaped partition board 23 are provided on the bottom plate 13. The cooling radiator is provided with a cross flow type fan 19. When fan 19 is rotated, air flows in from the inlet port 24. Air passes through the inside of the blades 19a of fan 19 and flows out to the outlet port 25. That is, in the cooling radiator 11b of the embodiment, air flows in from the direction shown by arrow a and flows out in the direction shown by arrow b through the inside of the blades 19a. The inlet port 24 for sucking air can be made larger by changing the shape of the partition boards into triangle pole shape. Thus, the air flow from the inlet port 24 to the outlet port 25 becomes smooth.

Figure 12A:
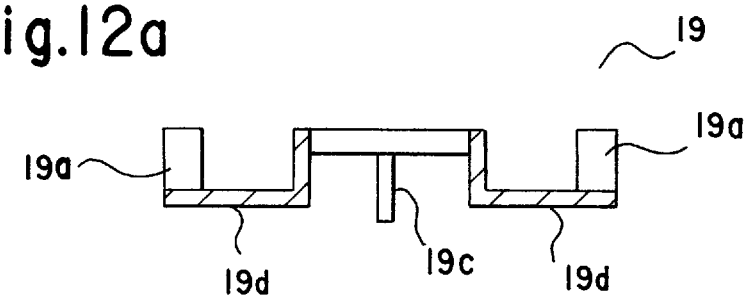
FIG. 12a is a vertical sectional view of a fan used in a cooling radiator according to the present invention.
Figure 12B:
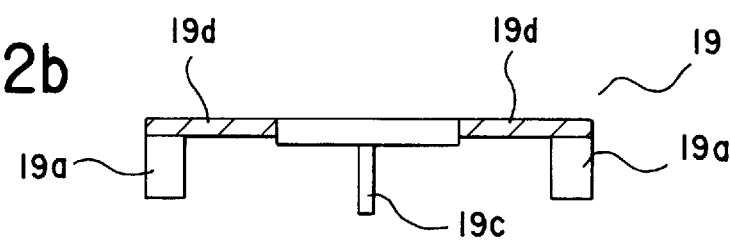
FIG. 12b is a vertical sectional view of a fan used in a cooling radiator according to the present invention.
Figure 12C:
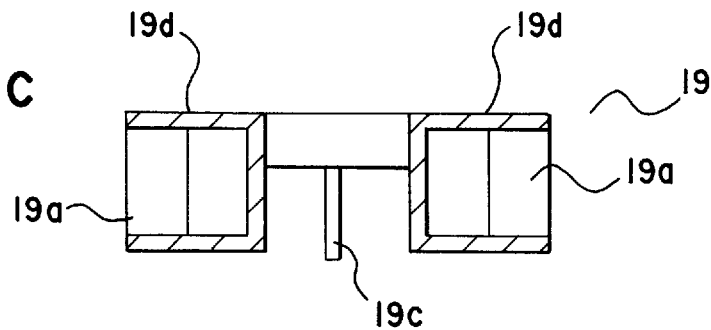
FIG. 12c is a vertical section view of a fan used in a cooling radiator according to the present invention.

FIGS. 12a, 12b, and 12c show the vertical sectional views of cross flow type fans. Blades 19a shown in FIGS. 12a to 12c are bent and mounted upright on mounting member 19d. Fan 19 shown in FIG. 12a is the fan mounted in FIG. 12. In this structure, blades 19a are mounted outside of the mounting member 19d. In the structure of fan 19 shown in FIG. 12b, blades 19a are hung and mounted outside of the mounting member 19d. In the structure of fan 19 shown in FIG. 12c, the mounting member 19d is formed in groove shape and blades 19a are mounted inside of the groove-shaped mounting member 19d. Symbol 19c in the figures shows a mounting shaft and this shaft is attached to the driving motor 20.

Figure 13:
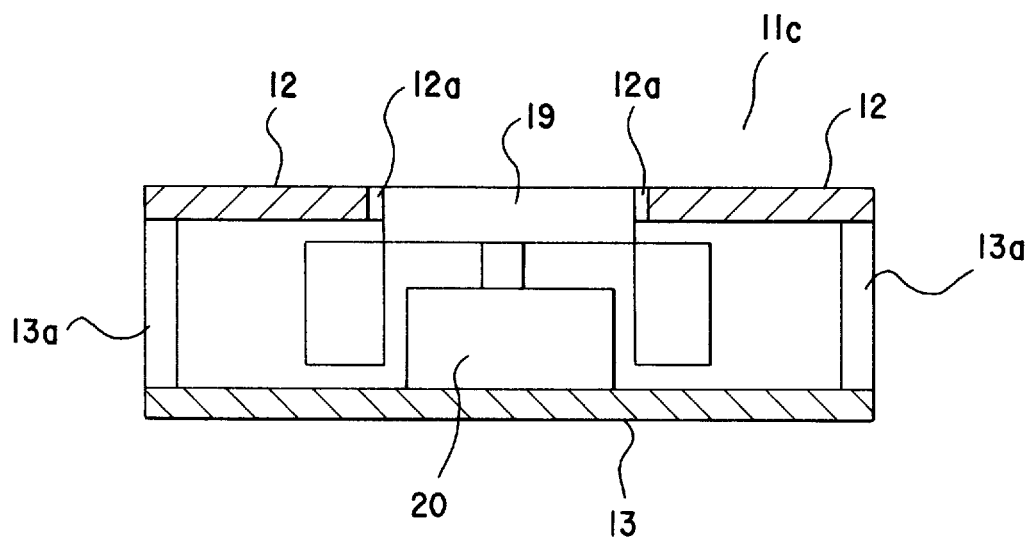
FIG. 13 is a vertical sectional view of another embodiment of a cooling radiator according to the present invention.

FIG. 13 shows a vertical sectional view of another embodiment of the cooling radiator of the present invention. In the cooling radiator 1c of the embodiment, a hole 12a is provided in the lid 12 so that the top portion of fan 19 can be accommodated. The upper surface of the lid 12 becomes even with the upper surface of fan 19. Thus, the cooling radiator 11c can be made thinner by providing a hole 12a in the lid 12, which can accommodate the top portion of fan 19. A hole can also be provided in the lid 12 of the cooling radiators of the embodiments shown in FIGS. 9, 11, and 12 so that the upper surface of the lid 12 becomes even with the upper surface of fan 19.

Figure 14:
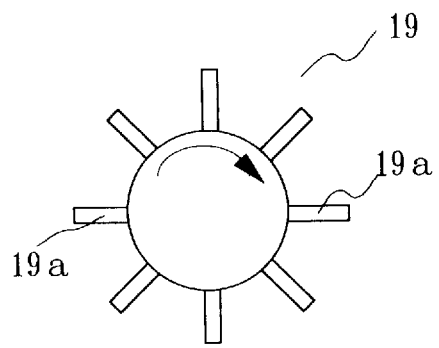
FIG. 14 is a top view of a fan which is attached to a cooling radiator according to the present invention.
Figure 15:
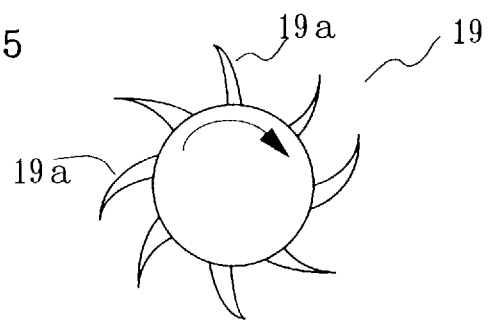
FIG. 15 is a top view of another embodiment of a fan which is attached to a cooling radiator according to the present invention.
Figure 16:
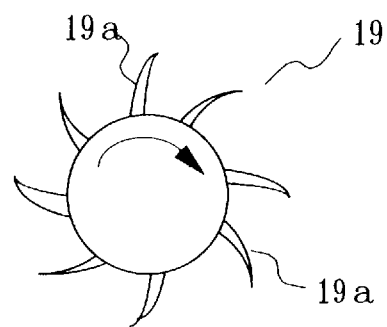
FIG. 16 is a top view of another embodiment of a fan which is attached to a cooling radiator according to the present invention.
Figure 17:
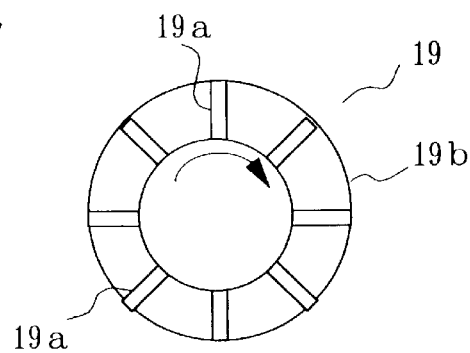
FIG. 17 is a top view of another embodiment of a fan which is attached to a cooling radiator according to the present invention.

FIGS. 14, 15, and 16 show the top views of fans attached to the cooling radiator of the present invention. In the structure of fan 19 shown in FIG. 14, blades 19a, 19a, 19a, 19a, 19a, 19a, 19a, and 19a protrude straight toward the outside and in radiation form. In the structure of fan 19 shown in FIG. 15, blades 19a, 19a, 19a, 19a, 19a, 19a, 19a, and 19a protrude outside in radiation form and blades 19a, 19a, 19a, 19a, 19a, 19a, and 19a are bent in the left direction. In the structure of fan 19 shown in FIG. 16, blades 19a, 19a, 19a, 19a, 19a, 19a, 19a, and 19a protrude outside in radiation form and blades 19a, 19a, 19a, 19a, 19a, 19a, 19a, and 19a are bent in the right direction.

FIGS. 17, 18, 19, and 20 show the top views of another embodiment of fan used in the cooling radiator of the present invention. In the structure of fan 19 shown in FIG. 17, blades 19a, 19a, 19a, 19a, 19a, 19a, 19a, and 19a protrude straight toward the outside and in radiation form. Furthermore, a plate 19b is attached to the bottom end of the blade. A plate 19b can also be attached to the top end of the blade 19a.

Figure 18:
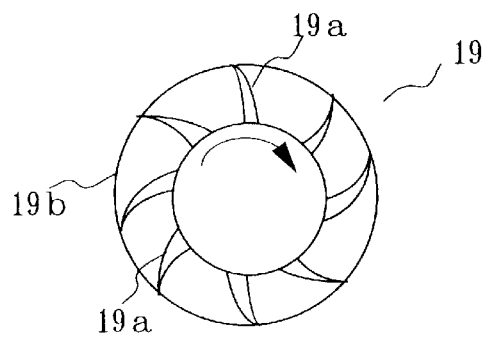
FIG. 18 is a top view of another embodiment of a fan which is attached to a cooling radiator according to the present invention.

In the structure of fan 19 shown in FIG. 18, blades 19a, 19a, 19a, 19a, 19a, 19a, 19a, and 19a protrude outside in radiation form and blades 19a, 19a, 19a, 19a, 19a, 19a, 19a, and 19a are bent in the left direction. Furthermore, a plate 19b is attached to the bottom end of the blade. A plate 19b can also be attached to the top end of the blade 19a.

Figure 19:
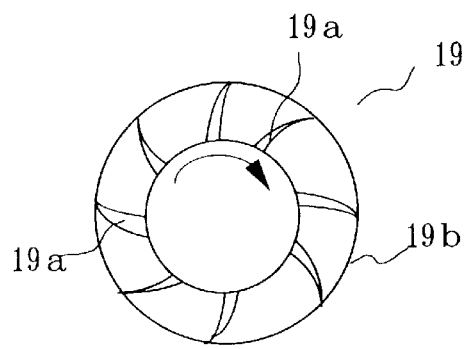
FIG. 19 is a top view of another embodiment of a fan which is attached to a cooling radiator according to the present invention.

In the structure of fan 19 shown in FIG. 19, blades 19a, 19a, 19a, 19a, 19a, 19a, 19a, and 19a protrude outside in radiation form and blades 19a, 19a, 19a, 19a, 19a, 19a, 19a, and 19a are bent in the right direction. Furthermore, a plate 19b is attached to the bottom plate of the blade. A plate 19b can also be attached to the top end of the blade 19a.

Figure 20:
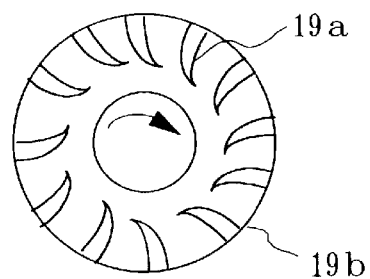
FIG. 20 is a top view of another embodiment of a fan which is attached to a cooling radiator according to the present invention.

FIG. 20 shows a top view of a cross flow type fan. In fan of the embodiment, blades 19a are mounted outside of the plate 19b. The blades 19a are slightly bent. Any one of fans shown in FIGS. 14 to 20 can be attached to the cooling radiators 11 to 11c of the present invention.

Figure 21:
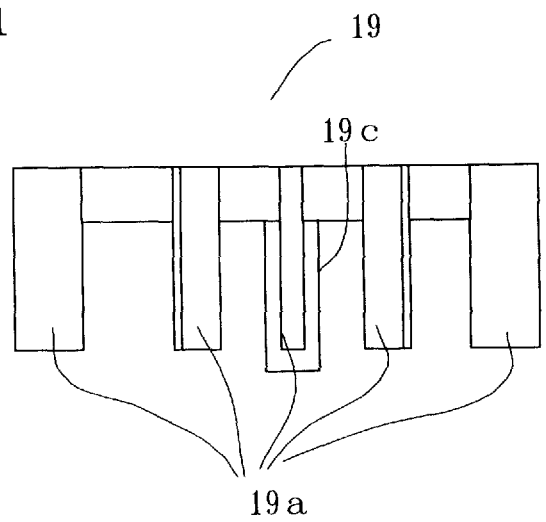
FIG. 21 is a front view of fan shown in FIGS. 14 to 16, which is attached to a cooling radiator according to the present invention.

FIG. 21 shows a front view of fan 19 shown in FIGS. 14, 15, and 16. Blades 9a are hung and mounted.

Figure 22:
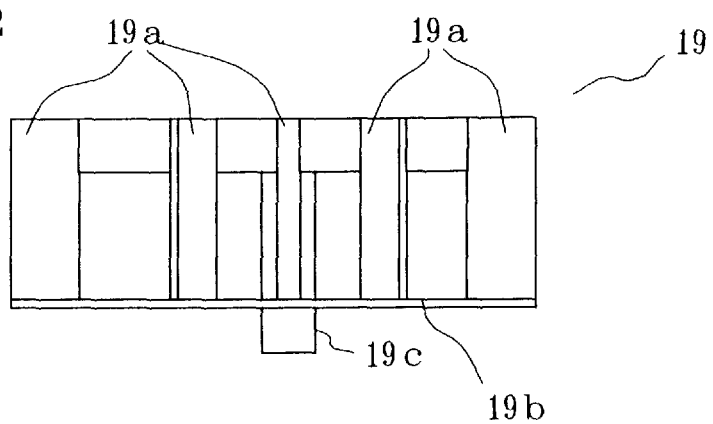
FIG. 22 is a front view of fan shown in FIGS. 17 to 19, which is attached to a cooling radiator according to the present invention.

FIG. 22 shows a front view of fan 19 shown in FIGS. 14, 15, and 16. In the structure of fan 19, plate 19b is provided at the underside of the hung blades 19a.

If the plurality of protruding portions 13a, 13a, 13a, 13a, 13a, 13a, . . . formed on the bottom plate 13 of the cooling radiators 11, 11a, 11b, and 11c of the present invention are not provided, the cooling radiators can also be used as air blowers.

Advantages of the Invention:

Since the cooling radiator of the present invention has the above-mentioned structure, special effects such as described below can be obtained. First, a gap near the upper inlet port which was conventionally needed becomes unnecessary by providing an inlet port and an outlet port on the sides of the cooling radiator, thereby making possible to reduce the mounting thickness of the cooling radiator and to make the entire size of equipment such as personal computers thin. Second, the frame itself can have a radiator function by bringing the lid of cooling radiator into contact with part of the frame of personal computer. The entire size of personal computer can be further made thinner by using part of the frame of personal computer as a lid of cooling radiator. Third, the cooling radiator can be used as a small air blower by removing the protruding portions formed on the lid, partition board, and bottom plate, if necessary. Fourth, the hole in the lid, which was conventionally needed to suck air, becomes unnecessary by providing an inlet port and an outlet port on the sides of the cooling radiator, thereby making possible to reduce the mounting thickness of a cooling radiator. Thus, the cooling radiator can be made thinner. Therefore, the personal computer itself can be made thin, in which the present invention is mounted. Fifth, the air flow path can occur on the same plane by making air flow in from the horizontal direction and out to the horizontal direction, thereby cooling more efficient.

What is claimed is:

1. A cooling radiator, comprising
   an air flow path defined by a cooperation between a bottom plate and a lid substantially coextensive with said bottom plate and spaced therefrom,
   partitioning means fixedly disposed in said flow path between said bottom plate and said lid for dividing said flow path into separated inflowing and outflowing portions,
   a rotatable fan having a driving motor disposed between said bottom plate and said lid and operative to induce the flow of air along said inlet and outlet portions of said flow path, and
   a plurality of projecting posts providing heat radiating surfaces upstanding from said bottom plate, said posts including a first set thereof forming support posts between said bottom plate and said lid for maintaining spacing therebetween, and a second set of posts freestanding from said bottom plate and effective to radiate heat from said bottom plate into said air flow path.

2. A cooling radiator as claimed in claim 1, wherein a plurality of protruding posts are formed on the partition board.

3. A cooling radiator as claimed in claim 1, wherein irregularities defining extended heat transfer surfaces are formed on a surface of said partition board.

4. A cooling radiator as claimed in claim 1, wherein a plurality of the protruding posts are formed on the lid.

5. A cooling radiator as claimed in claim 4, wherein irregularities defining extended heat transfer surfaces are formed on the lid.

6. A cooling radiator as claimed in claim 3 in which said irregularities are in the form of surface corrugations.

7. A cooling radiator comprising
   an air flow path defined by a cooperation between a bottom plate and a lid substantially coextensive with said bottom plate and spaced therefrom,
   partition means including a plurality of partition boards extending between said bottom plate and said lid and effective for maintaining spacing therebetween, said partition boards cooperating to define air inflow and outflow openings along peripheral sides of said radiator, a fan space and a heat transfer space separated from, but communicating with, said fan space within the interior of said radiator, and
   a rotatable fan having a driving motor disposed within said fan space and operative to circulate air flow through said air flow path from said inflow openings through said fan space and said heat transfer space and from said outlet openings.

8. A cooling radiator as claimed in claim 7, including protruding portions formed on the side walls of the partition boards.

9. A cooling radiator as claimed in claim 7, wherein irregularities defining extended heat transfer surfaces are formed on the side walls of the partition boards.

10. A cooling radiator as claimed in claim 9 in which said irregularities are in the form of surface corrugations.

* * * * *